United States Patent
Otsuka

(10) Patent No.: US 9,080,742 B2
(45) Date of Patent: Jul. 14, 2015

(54) NEAR INFRARED ILLUMINATOR

(71) Applicant: Stanley Electric Co., Ltd., Tokyo (JP)

(72) Inventor: Hideo Otsuka, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 70 days.

(21) Appl. No.: 13/914,511

(22) Filed: Jun. 10, 2013

(65) Prior Publication Data

US 2013/0327964 A1 Dec. 12, 2013

(30) Foreign Application Priority Data

Jun. 12, 2012 (JP) ................................. 2012-132437

(51) Int. Cl.
| | |
|---|---|
| *G01J 3/10* | (2006.01) |
| *F21V 5/04* | (2006.01) |
| *F21S 8/10* | (2006.01) |
| *B60Q 1/068* | (2006.01) |
| *B60Q 1/18* | (2006.01) |
| *G02B 19/00* | (2006.01) |
| *H01L 33/58* | (2010.01) |
| *G02B 3/00* | (2006.01) |

(52) U.S. Cl.
CPC ................ *F21V 5/04* (2013.01); *B60Q 1/0683* (2013.01); *B60Q 1/18* (2013.01); *F21S 48/1136* (2013.01); *F21S 48/1154* (2013.01); *F21S 48/1195* (2013.01); *F21S 48/1275* (2013.01); *G02B 3/0056* (2013.01); *G02B 19/00* (2013.01); *H01L 33/58* (2013.01)

(58) Field of Classification Search
None
See application file for complete search history.

(56) References Cited

U.S. PATENT DOCUMENTS

| | | | | | |
|---|---|---|---|---|---|
| 5,158,350 | A | * | 10/1992 | Sato | 362/538 |
| 5,797,674 | A | * | 8/1998 | Nagayama | 362/268 |
| 6,827,473 | B2 | * | 12/2004 | Kobayashi | 362/510 |
| 7,217,020 | B2 | * | 5/2007 | Finch | 362/544 |
| 7,887,197 | B2 | * | 2/2011 | Iwanaga | 353/94 |
| 2003/0076688 | A1 | * | 4/2003 | Kobayashi | 362/510 |
| 2006/0002128 | A1 | * | 1/2006 | Suzuki et al. | 362/509 |
| 2006/0109671 | A1 | * | 5/2006 | Finch | 362/507 |

(Continued)

FOREIGN PATENT DOCUMENTS

| | | | | |
|---|---|---|---|---|
| EP | 1 378 396 | A2 | 1/2004 | |
| EP | 1378396 | A2 * | 1/2004 | ................ B60R 1/00 |

(Continued)

OTHER PUBLICATIONS

The extended European Search Report for the related European Patent Application No. 13020035.5 dated Aug. 28, 2013.

*Primary Examiner* — Andrew Smyth
(74) *Attorney, Agent, or Firm* — Kenealy Vaidya LLP

(57) ABSTRACT

A near infrared illuminator can facilitate the adjustment of an optical axis thereof with favorable accuracy. The near infrared illuminator can include: a light source configured to emit near infrared rays; and a projector lens configured to project the near infrared rays emitted from the light source forward to form a predetermined light distribution pattern in front thereof. The projector lens can include a light distribution control section configured to project part of the near infrared rays emitted from the light source forward to form the predetermined light distribution pattern, and a marker forming section configured to project part of the near infrared rays emitted from the light source forward to form an alignment marker for positioning the light distribution pattern at a predetermined position beside the light distribution pattern.

17 Claims, 9 Drawing Sheets

(56) References Cited

U.S. PATENT DOCUMENTS

2007/0176187 A1* 8/2007 Iwanaga .......................... 257/79
2009/0052200 A1* 2/2009 Tessnow et al. ............. 362/510

FOREIGN PATENT DOCUMENTS

| JP | 2001-13039 A | 1/2001 | |
| JP | 2001013039 A * | 1/2001 | ............ G01M 11/06 |

* cited by examiner

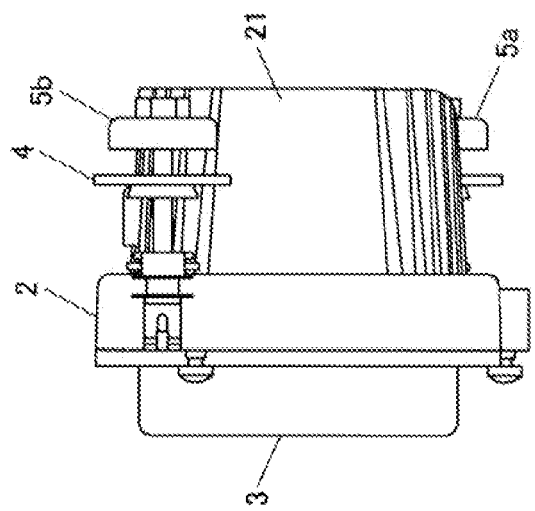
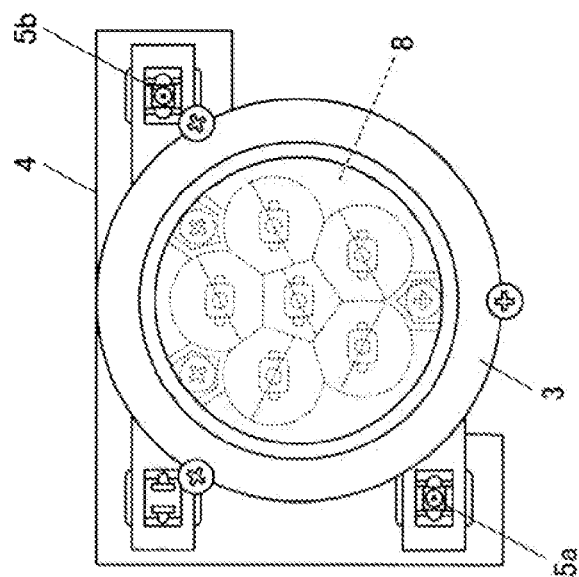

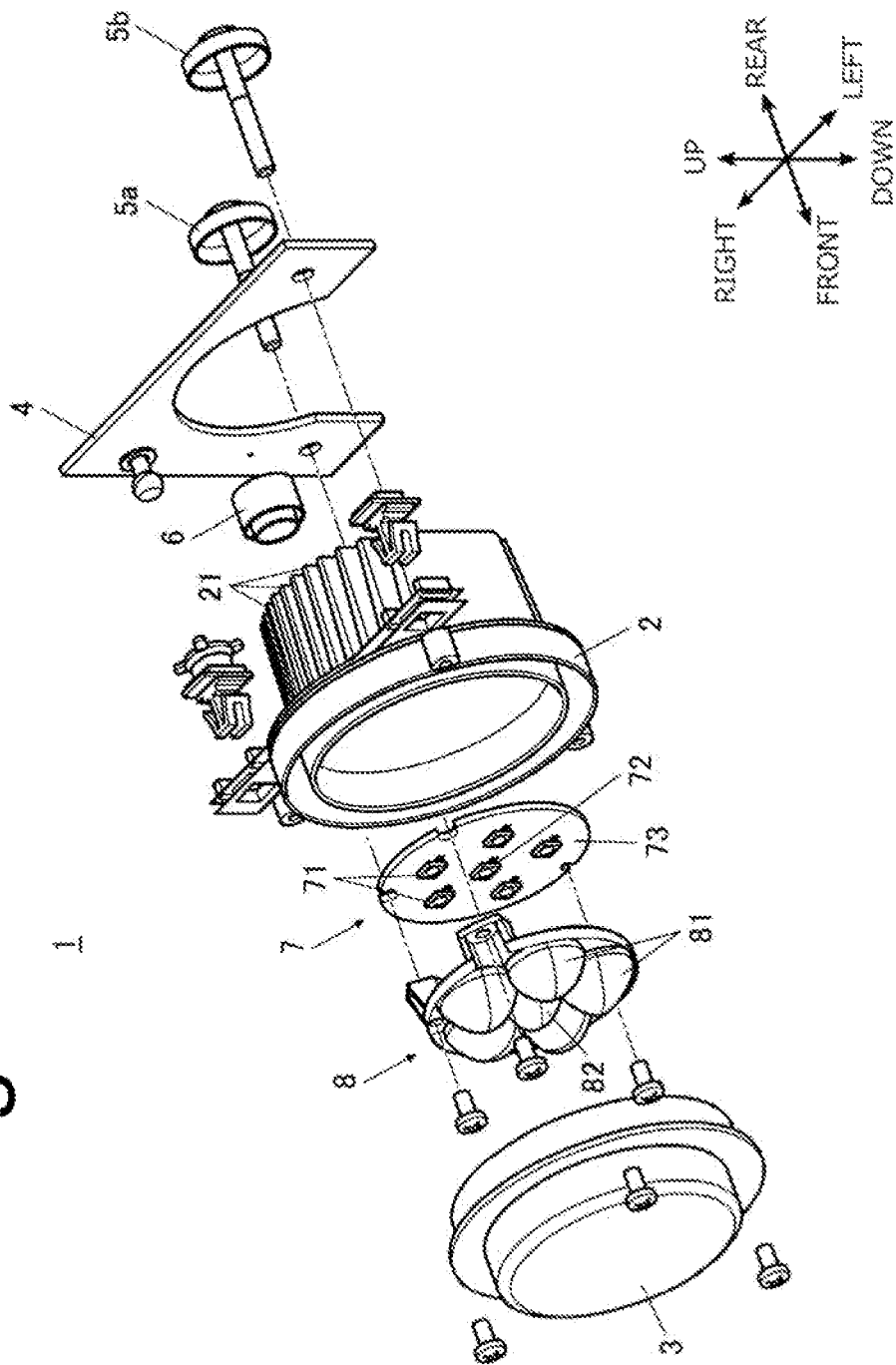

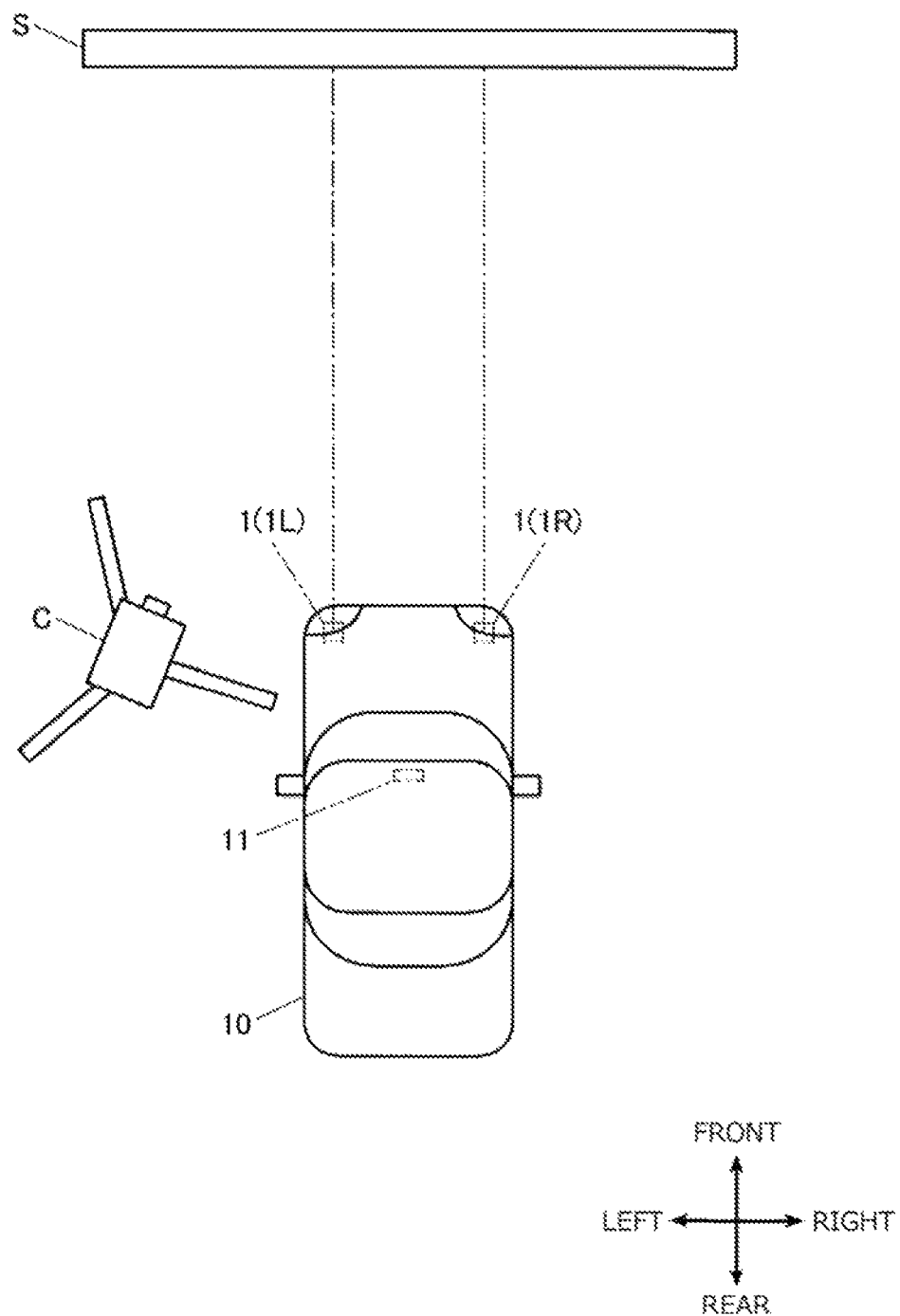

NEAR INFRARED ILLUMINATOR

This application claims the priority benefit under 35 U.S.C. §119 of Japanese Patent Application No. 2012-132437 filed on Jun. 12, 2012, which is hereby incorporated in its entirety by reference.

TECHNICAL FIELD

The presently disclosed subject matter relates to a near infrared illuminator.

BACKGROUND ART

In recent years, various driving support systems such as night vision systems and a marking light have been developed and put to practical use. In general types of driving support systems, an infrared camera can be provided to detect surroundings while illuminating the surroundings with infrared rays. When the system adopts a far infrared camera, the cost thereof can be expensive. In contrast to this, when a system adopts a near infrared camera utilizing near infrared rays for illumination, the system cost can be appropriately lowered.

In such a driving support system utilizing a near infrared camera and a near infrared illuminator, the optical axis of such a near infrared illuminator must or should be adjusted so as to form a light distribution pattern by the near infrared rays in an appropriate direction and at a certain position.

The near infrared rays emitted from such a near infrared illuminator are different from white light projected from a conventional headlight unit, but are invisible light which cannot be visually recognized. Therefore, an optical axis of such a near infrared illuminator cannot be adjusted with a common headlight tester (see, for example, Japanese Patent Application Laid-Open No. 2001-13039), which is conventionally used for optical axis adjustment. Further, to develop an optical axis adjusting device dedicated for near infrared rays may not be desirable because the system cost cannot be absorbed in view of the market size of near infrared illuminators.

Further, a general light distribution pattern formed by a common near infrared illuminator does not include a bright/dark boundary line such as a cut-off line in a light distribution pattern of a low beam formed by a headlight. In this context, it is difficult to grasp the direction and position of such a light distribution pattern formed by a common near infrared illuminator in the first place. Therefore, the optical axis adjustment with a high accuracy is difficult to be achieved.

SUMMARY

The presently disclosed subject matter was devised in view of these and other problems and features in association with the conventional art. According to an aspect of the presently disclosed subject matter, a near infrared illuminator can facilitate the optical axis adjustment with favorable accuracy.

According to another aspect of the presently disclosed subject matter, a near infrared illuminator can include: a light source configured to emit near infrared rays; and a projector lens configured to project the near infrared rays emitted from the light source forward to form a predetermined light distribution pattern in front thereof. In the near infrared illuminator with this configuration, the projector lens can include a light distribution control section configured to project part of the near infrared rays emitted from the light source forward to form the predetermined light distribution pattern, and a marker forming section configured to project part of the near infrared rays emitted from the light source forward to form an alignment marker for positioning the light distribution pattern at a predetermined position beside the light distribution pattern.

In the near infrared illuminator made in accordance with principles of the presently disclosed subject matter, the near infrared rays emitted from the light source can be projected forward by the light distribution control section of the projector lens so as to form a light distribution pattern. In addition to this, the marker forming section of the projection lens can project part of the near infrared rays forward so as to form an alignment marker for positioning the light distribution pattern at a predetermined position beside the light distribution pattern. With this configuration, when the optical axis of such a near infrared illuminator is to be adjusted, only the alignment marker can be captured by an infrared camera for adjustment to recognize the position of the light distribution pattern on the basis of the position of the alignment marker. Therefore, when the alignment marker is formed to be a predetermined condition, the position of the light distribution pattern can be appropriately adjusted, and by extension, the optical axis of the near infrared illuminator can be easily adjusted with favorable accuracy.

The marker forming section can form the alignment marker disposed a prescribed distance away from the light distribution pattern so that the formed alignment marker can be outside an image capturing range of an image capturing unit configured to detect the light distribution pattern.

The light distribution control section and the marker forming section of the projector lens can be integrally formed.

Further, in the near infrared illuminator the light source can have an optical axis directed forward; the projector lens can be disposed in front of the light source; the light distribution control section can be formed in an area of the projector lens including the optical axis of the light source; and the marker forming section can be formed at an end portion of the light distribution control section (or an end portion of the projector lens).

In addition, the marker forming section can include a plurality of marker forming sections so as to form four alignment markers above, below and on both sides of the light distribution pattern, for example.

With these configurations, the same or similar advantageous effects described above can be obtained.

BRIEF DESCRIPTION OF DRAWINGS

These and other characteristics, features, and advantages of the presently disclosed subject matter will become clear from the following description with reference to the accompanying drawings, wherein:

FIGS. 1A and 1B are a front view illustrating a near infrared illuminator made in accordance with principles of the presently disclosed subject matter, and a right side view thereof, respectively;

FIG. 2 is an exploded perspective view illustrating the near infrared illuminator of FIG. 1;

FIG. 7 is a diagram showing how the optical axis of the near infrared illuminator is adjusted;

DESCRIPTION OF EXEMPLARY EMBODIMENTS

A description will now be made below to near infrared illuminators of the presently disclosed subject matter with reference to the accompanying drawings in accordance with exemplary embodiments.

FIGS. 1A and 1B are a front view illustrating a near infrared illuminator made in accordance with principles of the presently disclosed subject matter, and a right side view thereof, respectively. FIG. 2 is a perspective exploded view illustrating the near infrared illuminator of FIG. 1.

Note that in the present description, the directions of "front (forward)," "back (rear, rearward)," "left," "right," "up (high)," and "down (low)" mean the directions when viewed with respect to the near infrared illuminator 1 installed in a vehicle body of an automobile to project light forward of the vehicle body.

Figure 6A:
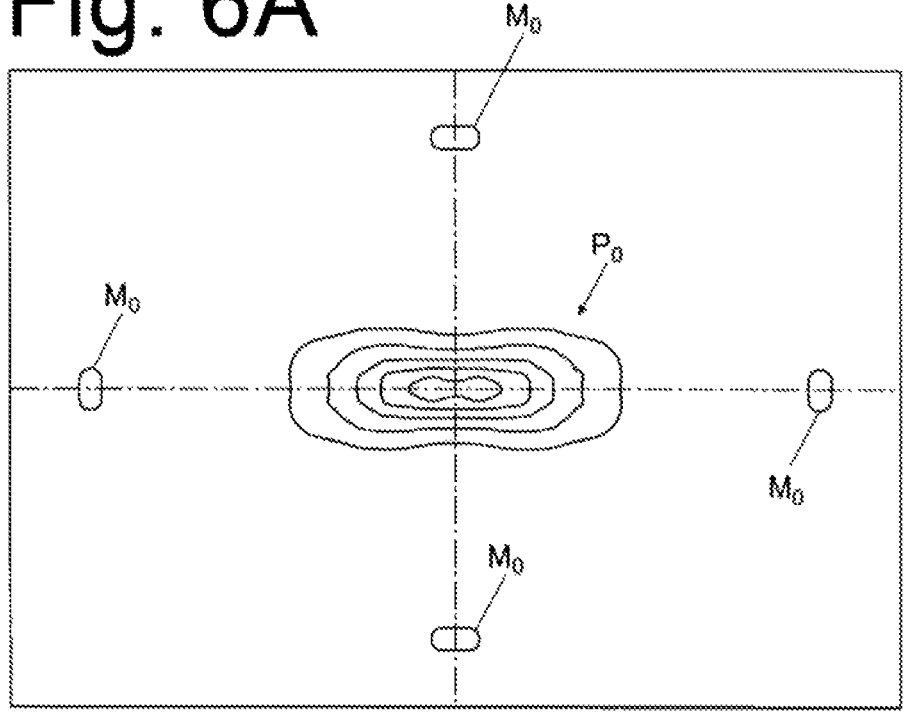
FIGS. 6A and 6B each are a diagram illustrating a light distribution pattern with alignment markers formed by the projector lens.
Figure 6B:
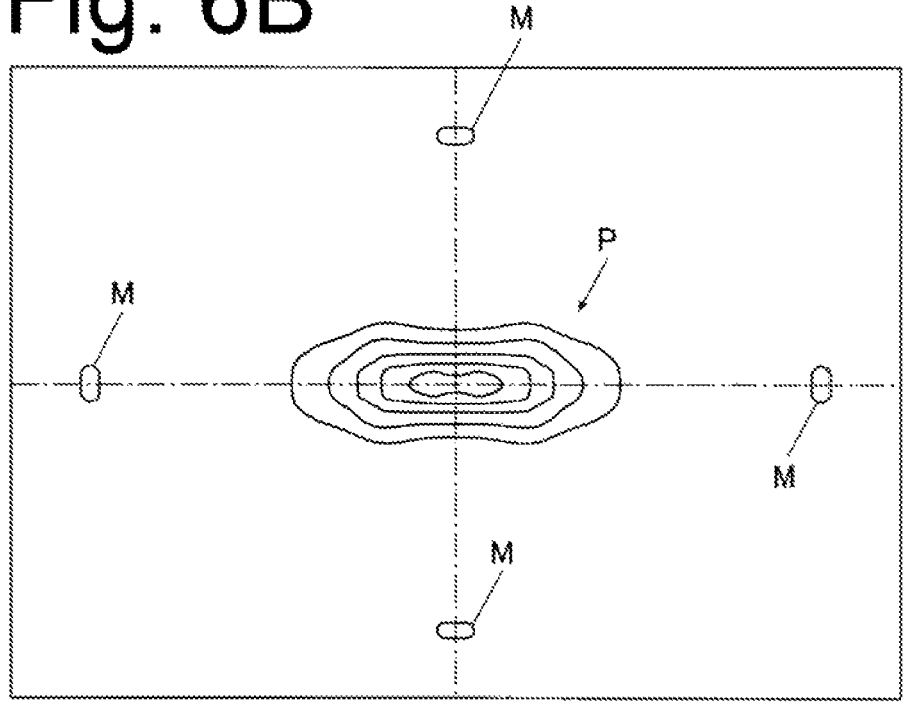
Figure 8A:
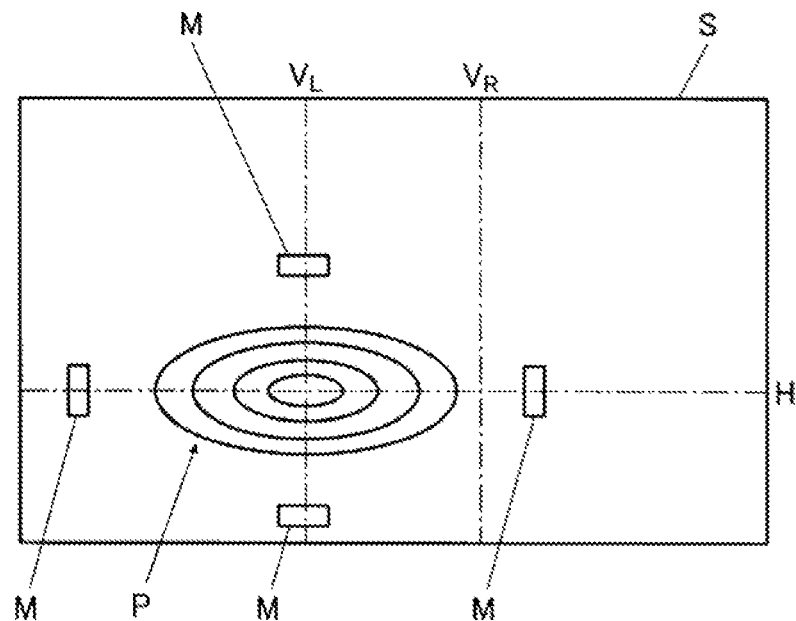
FIGS. 8A and 8B are diagrams each illustrating a light distribution pattern with alignment markers formed by the projector lens during the optical axis adjustment of the near infrared illuminator.
Figure 8B:
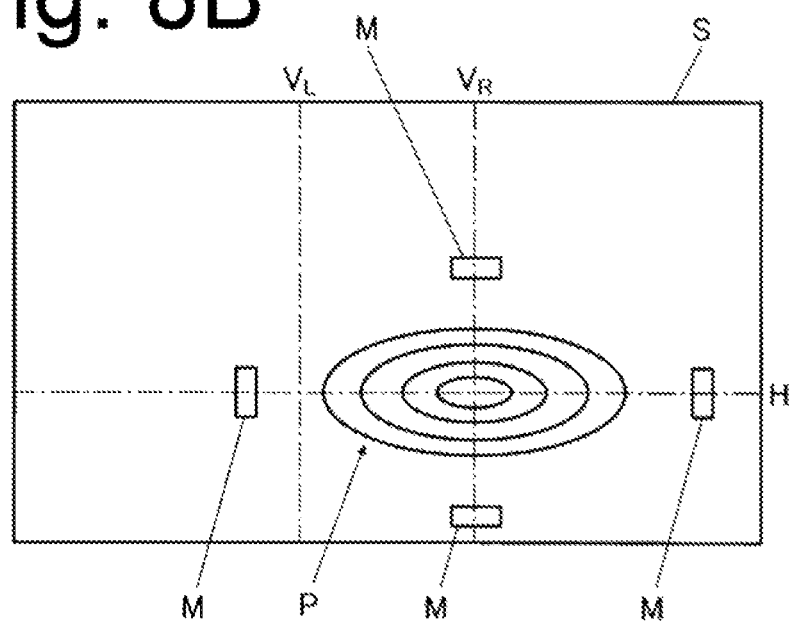

The near infrared illuminator 1 can be utilized in a night vision system installed in a vehicle body, so as to project near infrared light forward to form a predetermined light distribution pattern P (see, for example, FIG. 6B). Specifically, the near infrared illuminator 1 can include a housing 2 opened at its front portion; and an outer lens 3 covering the front opening of the housing 2, as shown in FIGS. 1A, 1B, and 2.

The rear surface of the housing 2 can include heat dissipation fins 21 formed thereon, and a plate-shaped bracket 4 can be attached to the housing 2 so as to surround the heat dissipation fins 21. The bracket 4 can be used to secure the near infrared illuminator 1 to a not-illustrated vehicle body. Specifically, the bracket 4 can be attached to the housing 2 via two bolts 5a and 5b for optical axis adjustment. The two bolts 5a and 5b for optical axis adjustment can be used to adjust the optical axis of the near infrared illuminator 1, and can be configured to allow the housing 2 to be inclined with respect to the bracket 4 in the vertical direction and horizontal direction independently. Further, an air cap 6 can be provided between the housing 2 and the bracket 4 so that a light chamber defined by the housing 2 and the outer lens 3 can be made watertight while the light chamber can be in communication with the outside thereof.

Inside the light chamber defined between the housing 2 and the outer lens 3, accommodated are a light source unit 7 and an inner lens 8.

In the illustrated exemplary embodiment, the light source unit 7 can include five infrared LEDs (light emitting diodes) 71 that can emit near infrared rays and one white LED 72 that can emit white light, and a substrate 73 perpendicular to the front-rear direction, on a front surface of which these LEDs 71 and 72 are mounted. In the present exemplary embodiment, the five infrared LEDs 71 and white LED 72 can be arranged to allow respective optical axes Ax (see FIGS. 4A and 4B) to extend forward while the five infrared LEDs 71 can surround the white LED 72, so that they can emit light forward. In an exemplary embodiment, the wavelengths of near infrared rays emitted from the infrared LEDs 71 can be 850 nm, 870 nm, 940 nm, and 950 nm, for example. In the present exemplary embodiment, the sensitivity of the infrared camera becomes maximum at 850 nm, and therefore, an infrared LED having a center wavelength of 850 nm can be advantageous for such an infrared camera.

Figure 3:
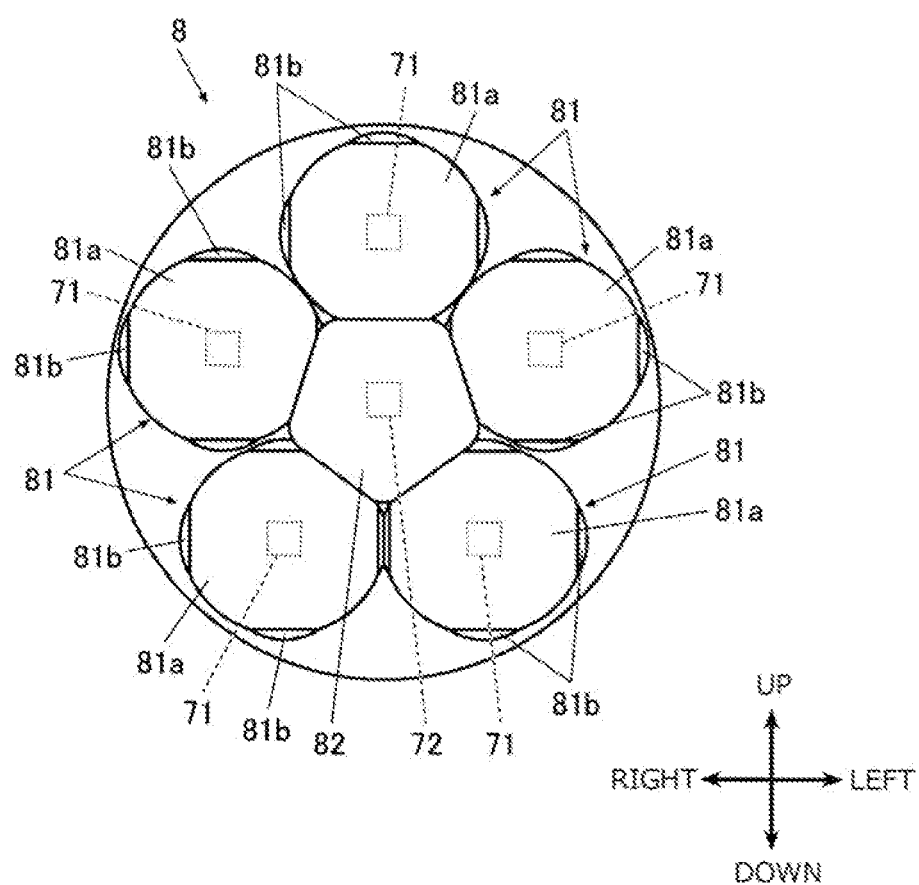
FIG. 3 is a front view illustrating an inner lens of the near infrared illuminator of FIG. 1.
Figure 4A:
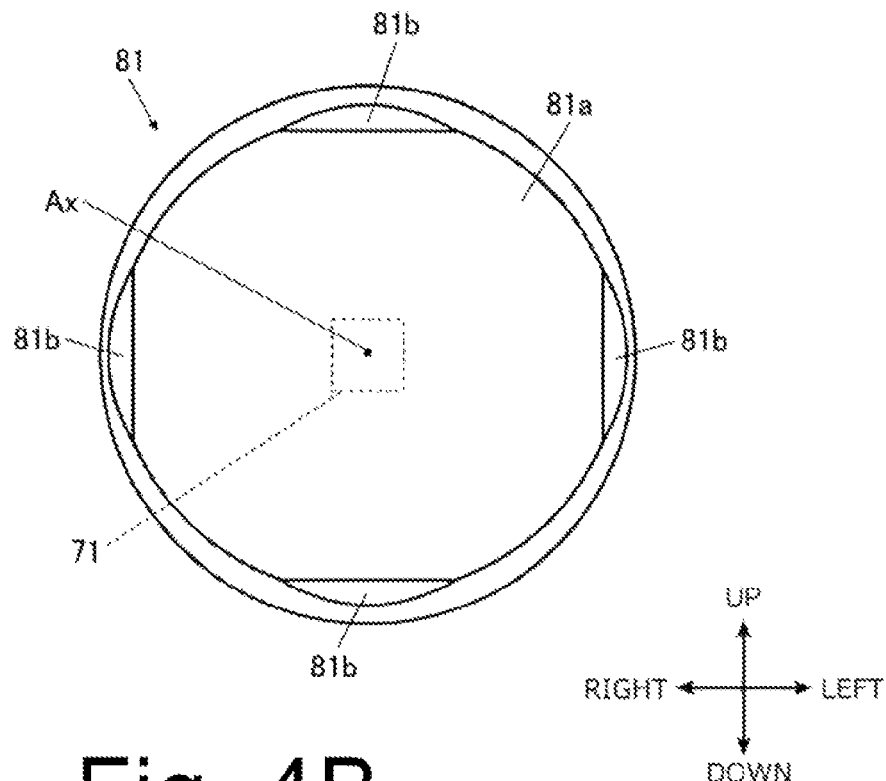
FIGS. 4A and 4B are a front view illustrating a projector lens made in accordance with principles of the presently disclosed subject matter, and a side view thereof, respectively.
Figure 4B:
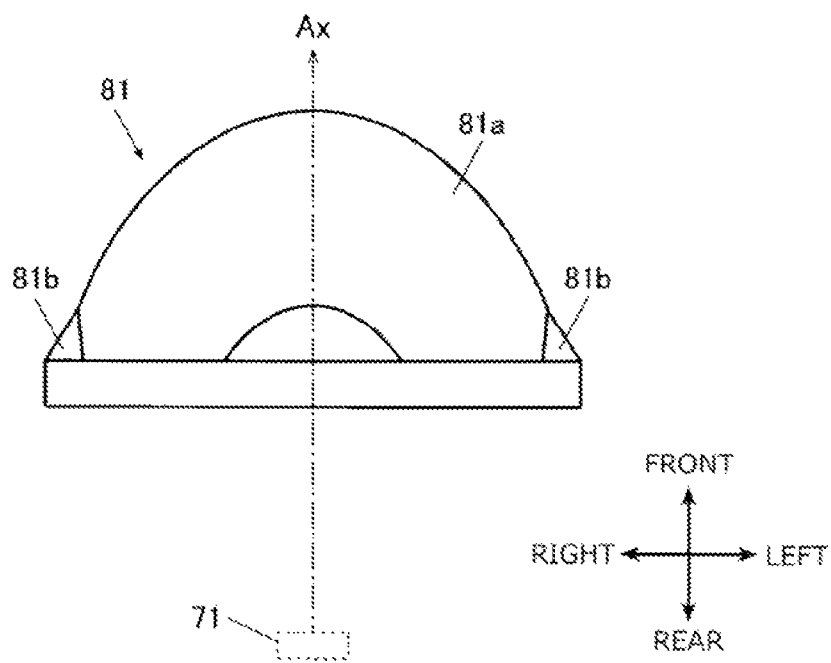
Figure 5:
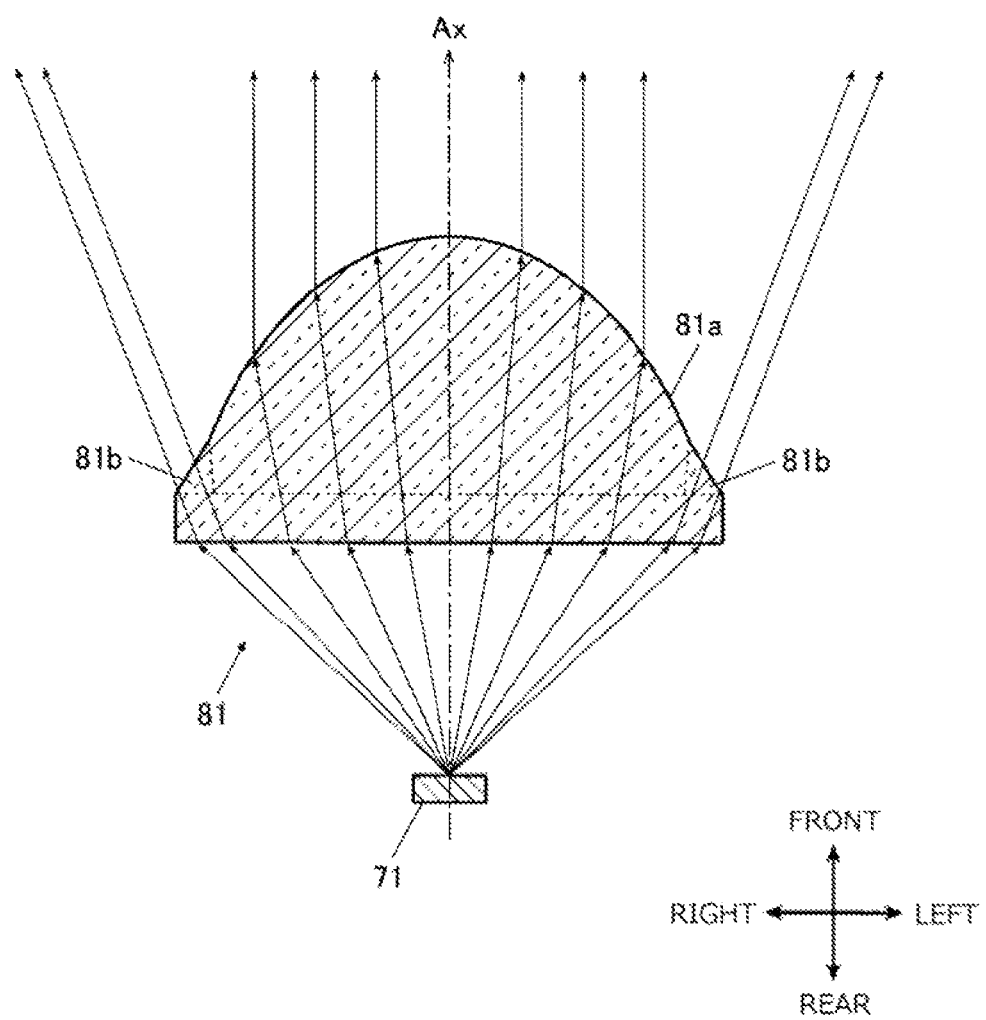
FIG. 5 is a diagram describing how light rays can travel through the projector lens (ray trajectory)

FIG. 3 is a front view illustrating the inner lens 8 of the near infrared illuminator 1 of FIG. 1. FIGS. 4A and 4B are a front view illustrating a projector lens 81 of the inner lens 8 to be described later and a side view thereof, respectively. FIG. 5 is a diagram describing how light rays can travel through the projector lens 81 (ray trajectory).

As shown in FIGS. 3A and 3B, the inner lens 8 can include five projector lenses 81 and one auxiliary lens 82 which can be formed integrally with each other. The inner lens 8 can be disposed in front of the light source unit 7. Specifically, in the inner lens 8, the auxiliary lens 82 can be placed in front of the white LED 72 while the five projector lenses 81 can surround the auxiliary lens 82 and be positioned in front of the respective five infrared LEDs 71 independently.

Each of the projector lenses 81 can be a plano-convex lens having a convex front face as shown in FIGS. 4 and 5, so that the near infrared rays emitted from the corresponding infrared LED 71 can be projected forward. The projector lens 81 can include a light distribution control section 81a that can form the light distribution pattern $P_0$, and four marker forming sections 81b that each can form an alignment marker $M_0$ for positioning the light distribution pattern $P_0$ (see FIG. 6A). The light distribution control section 81a and the four marker forming sections 81b can be formed integrally.

The light distribution control section 81a can be formed in a central area of the projector lens 81 including the optical axis Ax of the infrared LED 71 and excluding respective end portions in the vertical and horizontal directions (see FIG. 4A). The light distribution control section 81a can be configured to be capable of projecting near infrared rays emitted from the infrared LED 71 forward while forming the horizontally-long light distribution pattern $P_0$ having decreased luminance with an increased distance from the optical axis Ax (see FIG. 6A).

The marker forming section 81b can be formed at each end portion on either side of the light distribution control section 81a in the horizontal and vertical directions, and can have a light-exiting face (front face) having a smaller radius of curvature than that of the light-exiting face of the light distribution control section 81a. Each of the marker forming sections 81b can be configured to receive the near infrared rays emitted from the infrared LED 71 and travelling more outwardly than the light distribution control section 81a and refract the entering near infrared rays laterally so that the exiting near infrared rays are away from the optical axis Ax more while they are substantially collimated. In this manner, the marker forming sections 81b can form respective alignment markers $M_0$ with approximately rectangular spot shape positioned above, below, and on both sides of, the light distribution pattern $P_0$, as shown in FIG. 6A. In this case, the opposite two marker forming sections 81b (or, the vertically-opposite two marker forming sections 81b and the horizontally-opposite two marker forming sections 81b) can refract the near infrared rays by the approximately same angle of refraction with respect to the optical axis Ax. Note that the marker forming sections 81b are not necessarily provided to the respective vertical and horizontal sides of the light distribution control section 81a one by one as long as the marker forming sections 81b are formed at at least some of the sides of the light distribution control section 81a to form the alignment markers $M_0$ at respective certain positions with respect to the light distribution pattern $P_0$.

Figure 9:
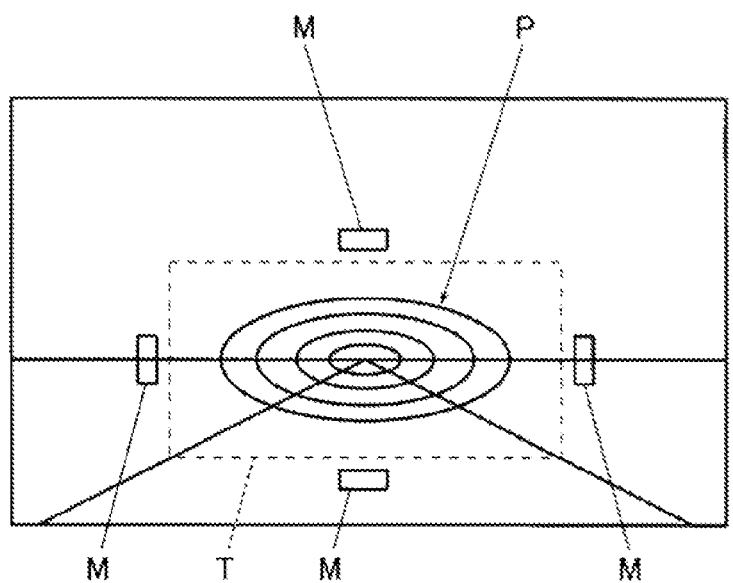
FIG. 9 is a diagram illustrating a light distribution pattern with alignment markers formed by the projector lens formed when the near infrared illuminator is actually used.

In this case, each of the marker forming sections 81b can be configured to form the corresponding alignment marker $M_O$ away from the light distribution pattern $P_O$ by a prescribed distance or more. By doing so, when the near infrared illuminator 1 is installed in a vehicle body 10 to be actually utilized in a night vision system, the respective alignment marker $M_O$ can be formed outside the image capturing range T of the infrared camera 11 that is used to detect the light distribution pattern $P_O$ (see FIGS. 7 and 9).

When the projector lenses 81 and the auxiliary lens 82 are arranged in a manner like those in the inner lens 8 as shown in FIG. 3, there are some projector lenses 81 that do not have four marker forming sections 81b depending on the overlapping situation between the adjacent projector lens 81 and the auxiliary lens 82. However, since the five projector lenses 81 in the present exemplary embodiment can form a single light distribution pattern P by overlaying the light distribution patterns $P_O$ with each other and respective alignment markers M by the alignment markers $M_O$ with each other, at least one marker forming section 81b may be formed in any of five projector lenses 81 (or the inner lens 8) on each side in the vertical and horizontal directions. Further, if a first projector lens 81 has three or less marker forming sections 81b, the first projector lens 81 may be provided with another marker forming section 81b at a position where the first projector lens 81 does not overlap with any projector lens 81 or an auxiliary lens 82 adjacent to the first projector lens 81.

With the near infrared illuminator 1 with the above configuration, part of near infrared rays emitted from each of the infrared LEDs 71 of the light source unit 7 can enter the light distribution control section 81a of the projector lens 81 corresponding to that infrared LED 71, so that the near infrared rays can be projected forward by that light distribution control section 81a. The projected near infrared rays from each of the projector lenses 81 can form the horizontally-long light distribution pattern $P_O$ having decreased luminance with an increased distance from the optical axis Ax as shown in FIG. 6A.

On the other hand, part of the near infrared rays emitted from each of the infrared LEDs 71 and travelling more outwardly than the light distribution control section 81a of the projector lens 81 corresponding to that infrared LED 71 in any of the horizontal and vertical directions can enter the marker forming section 81b and be refracted by the same laterally so that the exiting near infrared rays are away from the optical axis Ax more while they are substantially collimated. In this manner, the marker forming section 81b can form an alignment marker $M_O$ with approximately rectangular spot shape positioned above, below, or on any side of, the light distribution pattern $P_O$, as shown in FIG. 6A.

At this time, the opposite two marker forming sections 81b (or, the vertically-opposite two marker forming sections 81b and the horizontally-opposite two marker forming sections 81b) can refract the near infrared rays by the approximately same angle of refraction with respect to the optical axis Ax. Accordingly, the vertically opposite two marker forming sections 81b can form two opposite alignment markers $M_O$ at respective positions vertically opposite to each other away from the center (the position of the optical axis Ax) of the light distribution pattern $P_O$ by the same distance from the center (the position of the optical axis Ax) of the light distribution pattern $P_O$. In the same manner, the horizontally opposite two marker forming sections 81b can form two opposite alignment markers $M_O$ at respective positions horizontally opposite to each other away from the center (the position of the optical axis Ax) of the light distribution pattern $P_O$ by the same distance from the center (the position of the optical axis Ax) of the light distribution pattern $P_O$. Thus, assuming a straight line connecting the vertically opposite two alignment markers $M_O$ and another straight line connecting the horizontally opposite two alignment markers $M_O$. In this case, these two straight lines can cross each other at the center of the light distribution pattern $P_O$.

The thus formed light distribution patterns $P_O$ by the five projector lenses 81 of the inner lens 8 can be overlaid with one another while the thus formed alignment markers $M_O$ by the five projector lenses 81 of the inner lens 8 can also be overlaid with one another. In this manner, the light distribution pattern P can be formed with an increased luminance by the overlaid light distribution patterns $P_O$. Further, each of the alignment markers M can be formed with an increased luminance by the overlaid alignment markers $M_O$.

The white LED 72 of the light source unit 7 and the auxiliary lens 82 of the inner lens 8 are provided in order to conceal the red color slightly observed when the infrared LEDs 71 is turned on. The white light emitted from the white LED 72 and passing through the auxiliary lens 82 can cause an observer to visually recognize the near infrared illuminator 1 as being the only emitter of the white light.

A description will now be given of a method of adjusting the optical axis of the near infrared illuminator 1.

FIG. 7 is a diagram describing how the optical axis of the near infrared illuminator 1 is adjusted.

As shown in the drawing, the near infrared illuminator 1 is installed at each of the right and left headlights of the vehicle body 10 while being directed forward. Further, the vehicle body 10 can have an infrared camera 11 that can detect near infrared rays, thereby configuring the night vision system. The infrared camera 11 can be disposed in a vehicle interior on the upper portion of a front window of the vehicle body, for example, whereby the infrared camera 11 can detect the light distribution pattern P including the light distribution patterns $P_O$ formed in front of the vehicle body 10.

In the following description, note that the near infrared illuminator 1 installed in the left headlight of the vehicle body 10 is denoted by 1L while the other near infrared illuminator 1 installed in the right headlight of the vehicle body 10 is denoted by 1R in order to distinguish them from each other.

When the optical axis of the near infrared illuminator 1 is adjusted, a screen S is provided in front of the vehicle body 10 a predetermined distance away from the vehicle body 10 as shown in FIG. 7. Further, an adjustment camera C that can detect near infrared rays projected on the screen S is also provided beside the vehicle body 10. Herein, the adjustment camera C can be a common infrared camera used primarily for the optical axis adjustment of a near infrared illuminator 1, and accordingly, it may be a portable handy infrared camera that can be limited to detect near infrared rays.

Herein, the screen S has a horizontal line H and vertical lines $V_L$ and $V_R$ drawn in advance thereon so that the light distribution pattern P formed on the screen S can be directed in a prescribed direction and the center of the light distribution pattern P, or the optical axis of the near infrared illuminator 1, can coincide with the infinity. The vertical line $V_L$ is dedicated for the near infrared illuminator 1L in the left headlight while the vertical line $V_R$ is dedicated for the near infrared illuminator 1R in the right headlight.

Under this condition, an operator turns on the near infrared illuminator 1L in the left headlight of the vehicle body 10, and then, the near infrared illuminator 1L can form the light distribution pattern P and the four alignment markers M on the screen S and the adjustment camera C can detect them.

Next, the operator can appropriately adjust the optical axis of the near infrared illuminator 1L by the two bolts 5a and 5b for optical axis adjustment so that the four alignment markers M arranged on the four sides coincide with the horizontal line H and vertical line $V_L$.

Next, the operator turns off the near infrared illuminator 1L in the left headlight of the vehicle body 10 and turn on the near infrared illuminator 1R in the right headlight, and then, the near infrared illuminator 1R can form the light distribution pattern P and the four alignment markers M on the screen S and the adjustment camera C can detect them.

Then, the operator can appropriately adjust the optical axis of the near infrared illuminator 1R by the two bolts 5a and 5b for optical axis adjustment so that the four alignment markers M arranged on the four sides coincide with the horizontal line H and vertical line $V_R$.

In this manner, the optical axes of the near infrared illuminators 1L and 1R installed in the respective left and right headlights of the vehicle body 10 can be appropriately adjusted.

When the near infrared illuminators 1L and 1R of which the optical axes have been appropriately adjusted are turned on, the light distribution patterns P and the alignment markers M respectively formed by the near infrared illuminators 1L and 1R can coincide with each other at a farther position away from the screen S for the optical axis adjustment. Specifically, the four alignment markers M including the alignment markers $M_0$ can be disposed away from the light distribution pattern P including the light distribution patterns $P_0$ by a prescribed distance. Accordingly, the four alignment markers M can be formed outside the image capturing range T of the infrared camera 11 that is installed on the vehicle body 10, for detecting the light distribution pattern P (see FIGS. 7 and 9).

With the near infrared illuminator 1 with the above configuration, part of near infrared rays emitted from each of the infrared LEDs 71 can enter the light distribution control section 81a of the projector lens 81 corresponding to that infrared LED 71, so that the near infrared rays can be projected forward by that light distribution control section 81a to form the light distribution pattern P ($P_0$). On the other hand, part of the near infrared rays emitted from each of the infrared LEDs 71 and travelling more outwardly than the light distribution control section 81a can enter the marker forming section 81b and be refracted by the same laterally so that the marker forming section 81b can form the alignment marker M ($M_0$) for positioning the light distribution pattern P ($P_0$), positioned above, below, or on any side of, the light distribution pattern P ($P_0$). With this configuration, when the optical axis of the near infrared illuminator 1 is adjusted, the alignment markers M ($M_0$) can be the only imaged items to be captured by the adjustment camera C, so that the accurate position of the light distribution pattern P ($P_0$) can be grasped via the alignment markers M ($M_0$). Therefore, the alignment markers M ($M_0$) set in a predetermined condition (namely, the alignment markers M ($M_0$) being caused to coincide with the horizontal line H and the vertical line $V_L$, $V_R$ on the screen S as in the present exemplary embodiment) can lead to appropriate adjustment of the position of the light distribution pattern P ($P_0$), and by extension, the optical axis of the near infrared illuminator 1 can be easily adjusted with favorable accuracy.

Furthermore, the alignment markers M ($M_0$) can be disposed away from the light distribution pattern P ($P_0$) by a prescribed distance, so that the four alignment markers M ($M_0$) can be formed outside the image capturing range T of the infrared camera 11 for detecting the light distribution pattern P. This configuration can prevent the alignment marker M ($M_0$) from affecting a night vision system utilizing the near infrared illuminator 1 and the infrared camera 11.

Furthermore, since the projector lens 81 can include the light distribution control section 81a and the marker forming sections 81b formed integrally therein, the respective marker forming sections 81b can be formed with favorable positional accuracy with respect to the light distribution control section 81a, and by extension, the respective alignment markers M ($M_0$) formed by the marker forming sections 81a can be formed with favorable positional accuracy with respect to the light distribution pattern P ($P_0$).

The presently disclosed subject matter is not limited to the above-described exemplary embodiment, and can be applied to various embodiments without departing from the gist of the presently disclosed subject matter.

For example, although the above-described exemplary embodiment has been configured to include 5 sets of the infrared LED 71 and the projector lens 81 (five infrared LEDs 71 and five projector lens 81), the near infrared illuminator may include at least one set of the infrared LED 71 and the projector lens 81 according to the desired illuminance, cost, and the like.

In the above exemplary embodiment, the alignment markers $M_0$ are formed above, blow and on either sides of the light distribution pattern $P_0$ one by one, meaning that four alignment markers $M_0$ are formed with respect to one light distribution pattern $P_0$. However, it is not limiting, and a single alignment marker can be enough as long as the position of the light distribution pattern $P_0$ can be specified by the single alignment marker. In this case, the projector lens 81 can be provided with a single marker forming section 81b. Further, if the inner lens 8 includes a plurality of projector lenses 81 and any one of the projector lenses 81 includes such a marker forming section 81b, the remaining projector lens(es) 81 does (do) not include any marker forming section 81b. If the near infrared illuminator 1 can form only one alignment marker $M_0$, the position of the alignment marker $M_0$ may be above the light distribution pattern $P_0$. This is because, if the alignment marker $M_0$ is positioned below or beside the light distribution pattern $P_0$, the alignment marker $M_0$ may be within the image capturing range T of the infrared camera 11 depending on the road surface conditions. Therefore, the alignment marker above the light distribution pattern can reduce the possibility of the alignment marker to be positioned within the image capturing range T.

The number of the alignment markers $M_0$ can be large because many alignment markers can facilitate to identify the position (center position) of the light distribution pattern $P_0$. In one exemplary embodiment, two alignment markers $M_0$ positioned above and below the light distribution pattern $P_0$ or on both sides thereof can be advantageous as compared to the case of a single alignment marker. Another exemplary embodiment can include four alignment markers $M_0$.

In view of this, the respective five projector lenses 81 of the inner lens 8 do not have to have four marker forming portions 81b each, but the inner lens 8 may have a projector lens 81 without any marker forming section 81b as long as the inner lens 8 as a whole can form at least four alignment markers $M_0$ above, below and on both sides of the light distribution pattern $P_0$. However, in an exemplary embodiment, the alignment marker M include a plurality of alignment markers $M_0$ overlaid with each other because the resulting alignment marker M can have high illuminance so that the adjustment camera C can more easily capture the alignment marker M.

The shape of the alignment marker $M_0$ formed by the marker forming section 81b may be a circle, a triangle, or any spot-light shape aside from the rectangular shape as long as the adjustment camera S can capture the alignment marker $M_0$.

What is claimed is:

1. A near infrared illuminator for projecting near infrared light forward, comprising:
a light source configured to emit near infrared rays; and
a projector lens configured to project the near infrared rays emitted from the light source forward to form a predetermined light distribution pattern in front of the projector lens, the projector lens including
a light distribution control section disposed substantially at the center of the projector lens and configured to project part of the near infrared rays emitted from the light source forward to form the predetermined light distribution pattern, which is a horizontally long light distribution pattern, and
a marker forming section disposed substantially at a periphery of the projector lens and around the light distribution control section and configured to receive part of the near infrared rays emitted from the light source and refract the received near infrared rays laterally so that the exiting near infrared rays are projected forward and at an angle that diverges away from the optical axis to form an alignment marker with a spot shape at a predetermined position that is separate from and located beside the light distribution pattern and disposed a prescribed distance away from the light distribution pattern in order to position the light distribution pattern.

2. The near infrared illuminator according to claim 1, wherein the light distribution control section and the marker forming section of the projector lens are integrally formed.

3. The near infrared illuminator according to claim 1, wherein:
the light source has an optical axis directed forward;
the projector lens is disposed in front of the light source; and
the light distribution control section is formed in an area of the projector lens including the optical axis of the light source, and the marker forming section is formed at an end portion of the light distribution control section.

4. The near infrared illuminator according to claim 2, wherein:
the light source has an optical axis directed forward;
the projector lens is disposed in front of the light source; and
the light distribution control section is formed in an area of the projector lens including the optical axis of the light source, and the marker forming section is formed at an end portion of the light distribution control section.

5. The near infrared illuminator according to claim 1, wherein the marker forming section includes a plurality of marker forming sections so as to form four alignment markers one above, one below and one on each side of the light distribution pattern.

6. The near infrared illuminator according to claim 2, wherein the marker forming section includes a plurality of marker forming sections so as to form four alignment markers one above, one below and one on each side of the light distribution pattern.

7. The near infrared illuminator according to claim 3, wherein the marker forming section includes a plurality of marker forming sections so as to form four alignment markers one above, one below and one on each side of the light distribution pattern.

8. The near infrared illuminator according to claim 4, wherein the marker forming section includes a plurality of marker forming sections so as to form four alignment markers one above, one below and one on each side of the light distribution pattern.

9. The near infrared illuminator according to claim 1, wherein the light source is a light emitting diode.

10. The near infrared illuminator according to claim 9, wherein the light emitting diode emits light with a wavelength selected from the group consisting of 850 nm, 870 nm, 940 nm, and 950 nm.

11. The near infrared illuminator according to claim 3, wherein the light source is a light emitting diode.

12. The near infrared illuminator according to claim 11, wherein the light emitting diode emits light with a wavelength selected from the group consisting of 850 nm, 870 nm, 940 nm, and 950 nm.

13. The near infrared illuminator according to claim 1, wherein
the light source includes at least two light emitting diodes mounted on a substrate, and
the projector lens is provided to each of the two light emitting diodes so as to be disposed in front of the light emitting diode.

14. The near infrared illuminator according to claim 13, wherein
the light source further includes a white light emitting diode mounted on the substrate in addition to the light emitting diodes for emitting the near infrared rays, and
the white light emitting diode is configured to emit white light simultaneously with the light emitting diodes emitting the near infrared rays.

15. A headlight comprising the near infrared illuminator according to claim 9.

16. A night vision system comprising;
the headlight according to claim 15; and
an infrared camera configured to detect the predetermined light distribution pattern of the near infrared rays formed by the light distribution control section of the near infrared illuminator of the headlight.

17. The night vision system according to claim 16, wherein the infrared camera is configured to detect the light distribution pattern in an image capturing range, and
the alignment marker is formed outside the image capturing range.

* * * * *